US008626992B2

(12) United States Patent  
Ono et al.

(10) Patent No.: US 8,626,992 B2
(45) Date of Patent: Jan. 7, 2014

(54) STORAGE DEVICE WITH IDENTIFICATION INFORMATION

(75) Inventors: Chihiro Ono, Kanagawa (JP); Shigeru Komaki, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 25 days.

(21) Appl. No.: 13/237,769

(22) Filed: Sep. 20, 2011

(65) Prior Publication Data

US 2012/0137052 A1    May 31, 2012

(30) Foreign Application Priority Data

Nov. 30, 2010    (JP) ................................ 2010-267545

(51) Int. Cl.
*G06F 12/00*    (2006.01)
(52) U.S. Cl.
USPC .................................. 711/103; 711/E12.008
(58) Field of Classification Search
USPC .......................................... 711/103, E12.008
See application file for complete search history.

(56) References Cited

U.S. PATENT DOCUMENTS

| | | | | |
|---|---|---|---|---|
| 6,446,177 | B1 * | 9/2002 | Tanaka et al. ................. | 711/163 |
| RE42,398 | E * | 5/2011 | Tanaka et al. ................. | 711/163 |
| 7,978,516 | B2 * | 7/2011 | Olbrich et al. ........... | 365/185.11 |
| 8,001,350 | B2 | 8/2011 | Hiroyoshi | |
| 2008/0263305 | A1 | 10/2008 | Shu et al. | |
| 2010/0115183 | A1 * | 5/2010 | Araki et al. .................... | 711/103 |
| 2011/0078363 | A1 * | 3/2011 | Yeh et al. ....................... | 711/103 |

FOREIGN PATENT DOCUMENTS

| | | |
|---|---|---|
| JP | 2002-073424 | 3/2002 |
| JP | 2009-175992 A | 8/2009 |
| JP | 2009-217603 | 9/2009 |
| JP | 2009-245163 A | 10/2009 |
| JP | 2010-086601 | 4/2010 |
| JP | 2010-525453 | 7/2010 |

OTHER PUBLICATIONS

Office Action for Japanese Patent Application No. 2010-267545 dated Apr. 9, 2013.

* cited by examiner

*Primary Examiner* — Mardochee Chery
(74) *Attorney, Agent, or Firm* — Patterson & Sheridan, LLP

(57) ABSTRACT

According to one embodiment, a storage device includes identification information storage module, location information storage module, determination module, and control module. The identification information storage module stores identification information identifying nonvolatile memories. The location information storage module stores location information identifying bad area in the nonvolatile memories. The determination module determines whether each of pieces of identification information stored in each of the nonvolatile memories matches with any one of the pieces of identification information stored in the identification information storage module. The control module controls one of the nonvolatile memories to prevent one of the pieces of location information from being used, and to prevent access from the host, when the determination module determines that the one of the pieces of identification information of the one of the nonvolatile memories does not match with any one of the pieces of identification information stored in the identification information storage module.

12 Claims, 8 Drawing Sheets

FIG.2

| | |
|---|---|
| 201_1 — MEMORY ID OF FIRST FLASH MEMORY CHIP | 102 |
| 201_2 — MEMORY ID OF SECOND FLASH MEMORY CHIP | |
| 201_3 — MEMORY ID OF THIRD FLASH MEMORY CHIP | |
| 201_4 — MEMORY ID OF FOURTH FLASH MEMORY CHIP | |
| FIRST BAD BLOCK (CHIP NUMBER AND BLOCK NUMBER) | 202_1 |
| SECOND BAD BLOCK (CHIP NUMBER AND BLOCK NUMBER) | 202_2 |
| THIRD BAD BLOCK (CHIP NUMBER AND BLOCK NUMBER) | 202_3 |
| ... | ... |
| n-TH BAD BLOCK (CHIP NUMBER AND BLOCK NUMBER) | 202_n |

SERIAL FLASH MEMORY

US 8,626,992 B2

STORAGE DEVICE WITH IDENTIFICATION INFORMATION

CROSS-REFERENCE TO RELATED APPLICATIONS

This application is based upon and claims the benefit of priority from Japanese Patent Application No. 2010-267545, filed Nov. 30, 2010, the entire contents of which are incorporated herein by reference.

FIELD

Embodiments described herein relate generally to a storage device and a control method.

BACKGROUND

As for a storage location for data of an information processing device, a solid state drive (SSD) with a nonvolatile semiconductor memory such as a NAND-type flash memory mounted thereon has been attracting attention.

In the SSD, a plurality of flash memory chips are mounted as a storage location for data. Such a flash memory chip may generate a block (hereinafter, referred to as a "bad block") that cannot be used as a memory area because of a lot of errors or the like.

Therefore, a technology for managing bad blocks, and controlling writing of data depending on the bad blocks has been developed for the SSD.

In the SSD, a flash memory chip or a flash memory board is replaced, removed, and so on as necessary. In the conventional technology, when a flash memory chip or a flash memory board mounted on the SSD is replaced, removed, and so on, it is difficult to perform a processing appropriate for a certain situation for example because inconsistency occurs in managed location information of bad blocks.

BRIEF DESCRIPTION OF THE SEVERAL VIEWS OF THE DRAWINGS

A general architecture that implements the various features of the invention will now be described with reference to the drawings. The drawings and the associated descriptions are provided to illustrate embodiments of the invention and not to limit the scope of the invention.

FIG. 2 is an exemplary view of a configuration of a serial flash memory in the first embodiment;

DETAILED DESCRIPTION

In general, according to one embodiment of the invention, a storage device, comprises an identification information storage module, a location information storage module, a determination module, and a control module. The identification information storage module is configured to store therein a plurality of pieces of identification information that identify a plurality of nonvolatile memories, respectively, the nonvolatile memories being to be accessed from a host. The location information storage module is configured to store therein pieces of location information identifying a bad area in one of the nonvolatile memories. The determination module is configured to determine whether each of pieces of identification information stored in each of the nonvolatile memories connected thereto matches with any one of the pieces of identification information stored in the identification information storage module. The control module is configured to control one of the nonvolatile memories identified by one of the pieces of the identification information to prevent one of the pieces of location information stored in the location information storage module from being used, and to prevent access from the host, when the determination module determines that the one of the pieces of identification information of the one of the nonvolatile memories does not match with any one of the pieces of identification information stored in the identification information storage module.

An exemplary embodiment is described below with reference to the accompanying drawings.

An example in which a storage device and a control method according to the embodiment are applied to a solid state drive (SSD) device connected to a personal computer serving as a host device will be described below.

Figure 1:
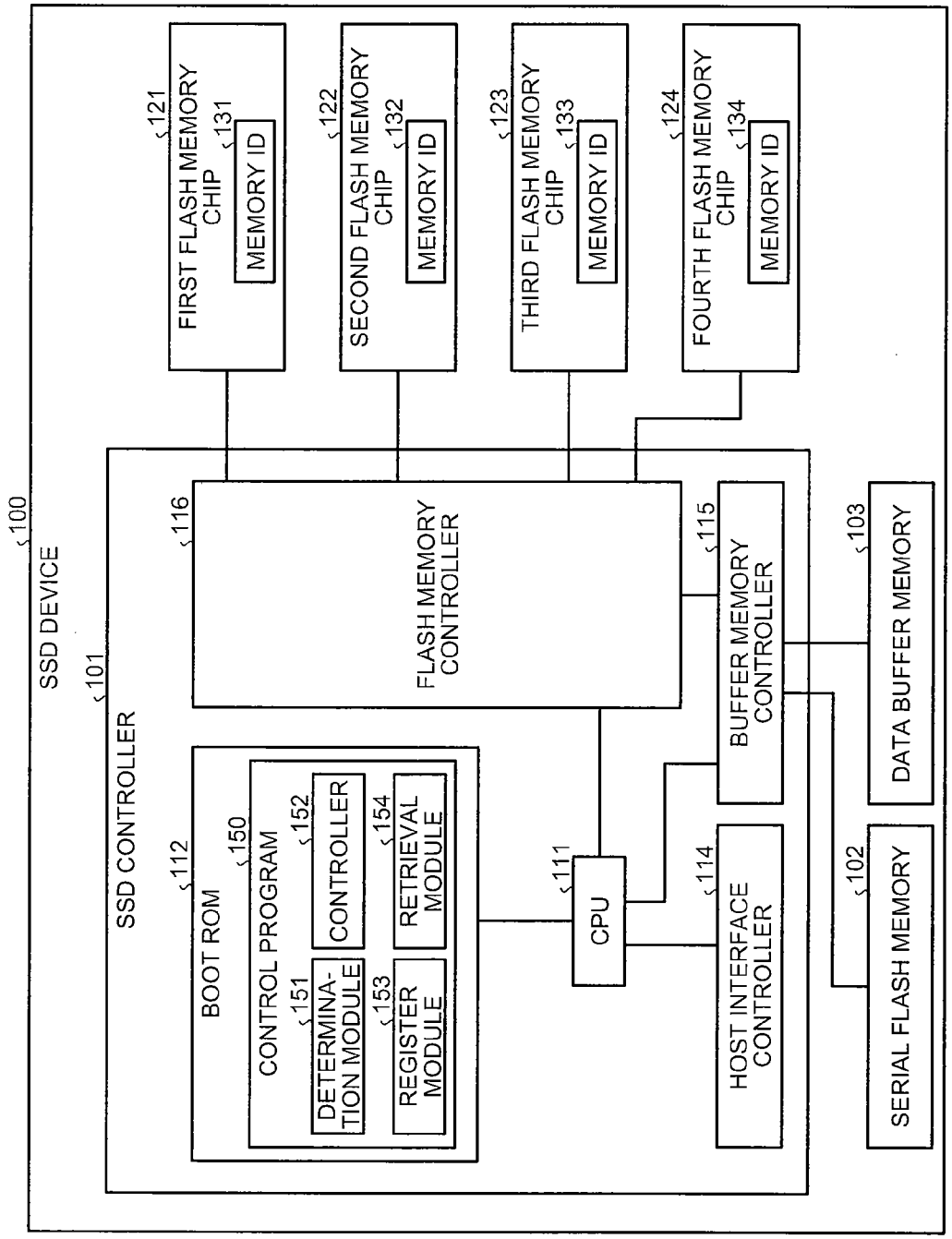
FIG. 1 is an exemplary block diagram of a configuration of an SSD device according to a first embodiment.

FIG. 1 is a block diagram of a configuration of an SSD device 100 according to the embodiment.

As illustrated in FIG. 1, the SSD device (storage device) 100 functions as a memory of an information processing device such as a personal computer, and comprises an SSD controller 101, a serial flash memory 102, a data buffer memory 103, a first flash memory chip 121, a second flash memory chip 122, a third flash memory chip 123, and a fourth flash memory chip 124.

The SSD device 100 according to the embodiment is an example in which four flash memory chips are mounted. However, as for the number of flash memory chips, the SSD device 100 may have various configurations. Thus, it is not limited to the configuration of the embodiment, but general concept of the embodiment is applicable to any configurations.

The first flash memory chip 121, the second flash memory chip 122, the third flash memory chip 123, and the fourth flash memory chip 124 are NAND-type nonvolatile memories that can continue to retain memory contents such as data even if the power supply is cut off. The first flash memory chip 121 to the fourth flash memory chip 124 are to be accessed from the host, and data is read therefrom or written thereto in accordance with a request from the host.

The first flash memory chip 121, the second flash memory chip 122, the third flash memory chip 123, and the fourth flash memory chip 124 are divided into areas in block units. In this embodiment, one block is composed of 16 sectors. However, the block configuration is not limited thereto. In the first flash memory chip 121 to the fourth flash memory chip 124, deletion and writing of data are performed in the block units. A block number is assigned to each block. The block number is used as location information of a block when the block is accessed, and so on.

The first flash memory chip 121, the second flash memory chip 122, the third flash memory chip 123, and the fourth flash memory chip 124 identify and manage a bad area that cannot be accessed by writing, reading, or the like in the block units.

Hereinafter, the block that becomes the bad area will be referred to as a "bad block". In the embodiment, the bad area is managed in the block units as an example. However, it is not limited to be managed in the block units, and may be managed in other units.

The first flash memory chip 121, the second flash memory chip 122, the third flash memory chip 123, and the fourth flash memory chip 124 are inspected before shipment or during failure diagnosis or the like of the SSD device 100. In the inspection, a flash memory chip that does not satisfy a required standard is replaced. After the flash memory chip is replaced, the inspection is conducted on the flash memory chips again. Conventionally, for the SSD device in which replacement is completed, all of the flash memory chips or flash memory boards are inspected so as to retrieve bad blocks. However, if the retrieval is performed on all of the blocks in all of the flash memory chips or the flash memory boards, it requires a considerable time. Therefore, in the embodiment, the retrieval is performed only on the replaced flash memory chip, thereby reducing the retrieval time.

At first, in the manufacturing process of the SSD device 100 according to the embodiment, a memory ID is stored in a specified area in each of the flash memory chips in advance. For example, the first flash memory chip 121 stores therein a memory ID 131, the second flash memory chip 122 stores therein a memory ID 132, the third flash memory chip 123 stores therein a memory ID 133, and the fourth flash memory chip 124 stores therein a memory ID 134.

Each of the memory IDs 131 to 134 is an ID assigned uniquely to the corresponding flash memory chip to be manufactured. Each of the memory IDs 131 to 134 of the corresponding flash memory chip is data of about several bytes to tens of bytes, and is a value unique to the corresponding flash memory chip. Therefore, there are no flash memory chips having an identical memory ID. In the embodiment, unique serial numbers of 16 bytes are assigned to the memory IDs 131 to 134.

Therefore, in the case where a flash memory chip is replaced, if the flash memory chip is accessed, the memory ID that can be referred to from the SSD controller 101 is changed.

The data buffer memory 103 functions as a data transfer cache between the first flash memory chip 121 to the fourth flash memory chip 124, and as a work area memory for a central processing unit (CPU) 111. For example, the data buffer memory 103 is a volatile memory that temporarily stores therein data received from the host device, which is not illustrated, to be written to the first flash memory chip 121 to the fourth flash memory chip 124, and data read from the first flash memory chip 121 to the fourth flash memory chip 124 to be transferred to the host device when data is transferred. A dynamic random access memory (DRAM) is used as the data buffer memory 103, for example. Instead of a DRAM, a ferroelectric random access memory (FeRAM) may be used.

The serial flash memory 102 is a nonvolatile memory that can continue to retain data for conducting an inspection on a flash memory chip or the like.

FIG. 2 is a view illustrating an example of a configuration of the serial flash memory 102. As illustrated in FIG. 2, the serial flash memory 102 stores therein a memory ID 201_1 of the first flash memory chip, a memory ID 201_2 of the second flash memory chip, a memory ID 201_3 of the third flash memory chip, and a memory ID 201_4 of the fourth flash memory chip. In other words, the serial flash memory 102 according to the embodiment stores therein the memory IDs 201_1 to 201_4 of the first flash memory chip 121 to the fourth flash memory chip 124 of 64 bytes as a whole. In this manner, the serial flash memory 102 stores therein (a plurality of) memory IDs for the number of the connected flash memory chips.

Furthermore, the serial flash memory 102 stores therein location information for identifying bad blocks in the first flash memory chip 121 to the fourth flash memory chip 124 (a first bad block 202_1, a second bad block 202_2, a third bad block 202_3, . . . , and an n-th bad block 202_$n$). In the embodiment, the serial flash memory 102 stores therein a chip number and a block number as the location information of a bad block. The chip number is a number for identifying a destination of the SSD device 100, that is, a connected flash memory chip. It is sufficient to identify the connected flash memory chip, and a memory ID, for example, may be used as the information for identifying the chip.

In other words, the flash memory chips contain bad blocks at the time of shipment, and store therein information indicating whether a block is a bad block for each of the blocks in advance. Because the bad block is a block from and to which data cannot be read and written normally, the SSD device 100 needs to access to the data while avoiding such bad blocks.

Therefore, in the manufacturing process of the SSD device 100, after the flash memory chips are connected, a retrieval module 154 retrieves the bad blocks recorded at the time of the shipment of the flash memories. A register module 153 then registers the location information of the bad blocks 202_1 to 202_$n$, which is a retrieval result, in the serial flash memory 102.

In the embodiment, the serial flash memory is used as a memory that stores therein the memory IDs and the location information of the bad blocks. Alternatively, other nonvolatile memories may be used.

Referring back to FIG. 1, the SSD controller 101 comprises the CPU 111, a boot read-only memory (ROM) 112, a host interface controller 114, a buffer memory controller 115, and a flash memory controller 116.

The host interface controller 114 is a circuit that has a function for communicating with and connecting to the host device.

The buffer memory controller 115 is a circuit that has a function for controlling data access, such as write and read of data to and from the data buffer memory 103.

The flash memory controller 116 is a circuit that has a function for controlling data access, such as write and read of data to and from the first flash memory chip 121 to the fourth flash memory chip 124.

The boot ROM 112 stores therein a control program 150.

The CPU 111 controls the host interface controller 114, the buffer memory controller 115, and the flash memory controller 116, and processes and controls a command (instruction) of data access, such as write and read of data to and from the first flash memory chip 121 to the fourth flash memory chip 124.

At the time of booting of the SSD device 100, the CPU 111 reads a boot program stored in the boot ROM 112, loads the boot program on the data buffer memory 103 or the like, and thus executes firmware. When an inspection is conducted on the SSD device 100, the control program 150 is invoked. This allows a determination module 151, a controller 152, the register module 153, and the retrieval module 154 stored in the control program 150 to be realized as a software configuration on the CPU 111.

The determination module 151 determines whether each of the memory IDs 131 to 134 stored in the flash memory chips 121 to 124 connected to the SSD device 100 match with any one of the plurality of memory IDs 201_1 to 201_4 stored in the serial flash memory 102.

The controller 152 controls the flash memory chips 121 to 124 via the flash memory controller 116. For example, if the determination module 151 determines that one of the memory IDs of the flash memory chips 121 to 124 does not match with any of the memory IDs stored in the serial flash memory 102, the location information of the bad blocks in the flash memory chip storing therein the non-matched memory ID cannot be used because it is different from the location information of the bad blocks stored in the serial flash memory 102. Therefore, the controller 152 performs control so as to stop using the location information of the bad blocks stored in the serial flash memory 102 for the flash memory chip that stores therein the non-matched memory ID, and to prevent access from the host to the flash memory chip.

If the determination module 151 determines that any of the memory IDs 131 to 134 stored in the flash memory chips 121 to 124 does not match with the memory IDs 201_1 to 201_4 stored in the serial flash memory 102, the retrieval module 154 retrieves the bad blocks from the flash memory chip that stores therein the non-matched memory ID.

The register module 153 registers the location information of the bad blocks retrieved by the retrieval module 154 in a storage area that stores therein the location information of the bad blocks in the serial flash memory 102.

When the inspection is conducted on the SSD device 100 for the first time, the serial flash memory 102 stores therein no memory ID and no location information of bad blocks. In this case, the retrieval module 154 retrieves the bad blocks from the first flash memory chip 121 to the fourth flash memory chip 124 that are connected to the SSD device 100. The register module 153 then registers the memory IDs of the connected flash memory chips in the serial flash memory 102, and registers the location information of the bad blocks retrieved by the retrieval module 154 in the serial flash memory 102.

Figure 3:
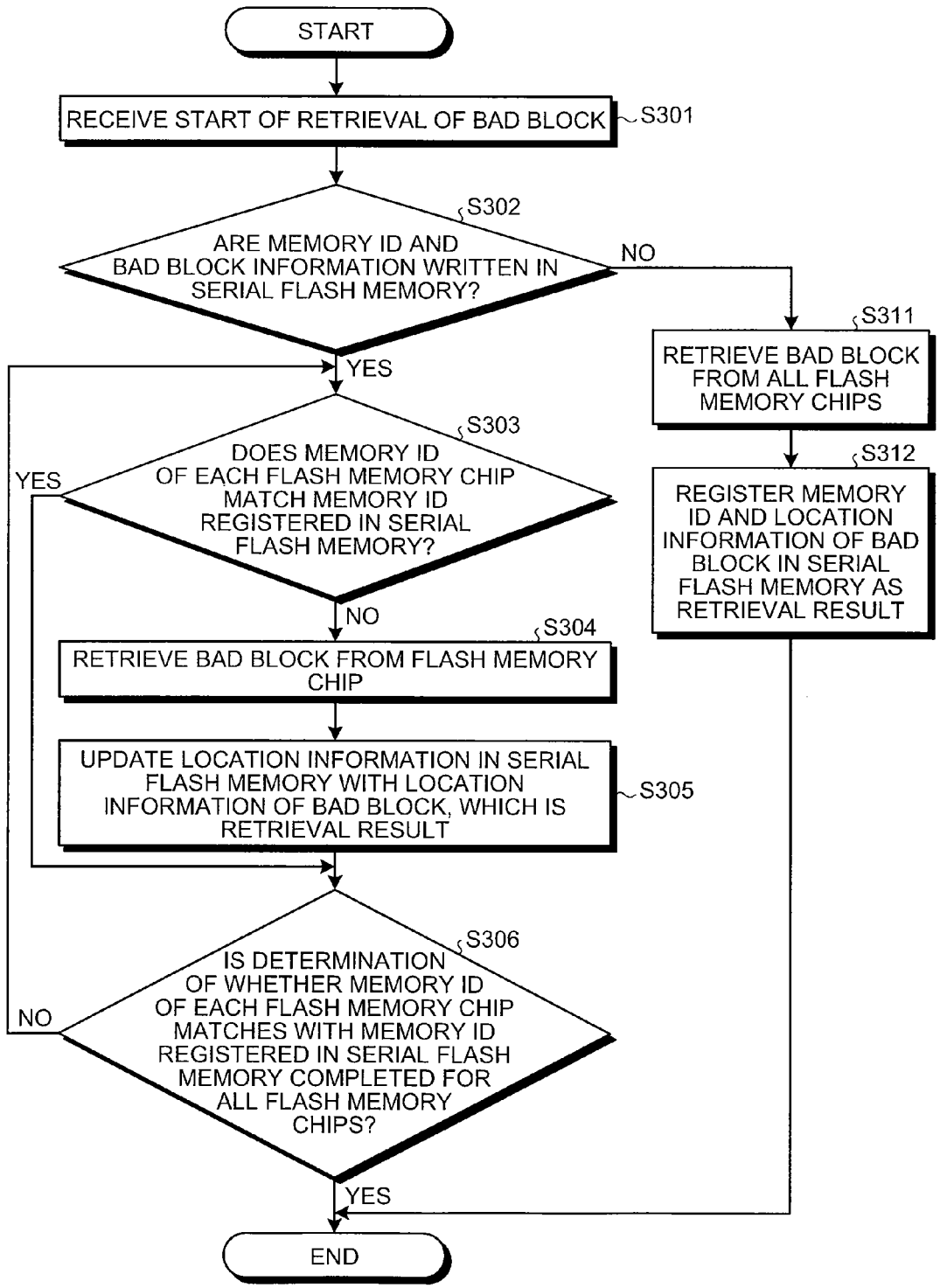
FIG. 3 is an exemplary flowchart of retrieval processing of bad blocks in the SSD device in the first embodiment.

The retrieval processing of the bad blocks in the SSD device 100 according to the embodiment will now be described. FIG. 3 is a flowchart of the processing described above in the SSD device 100 according to the embodiment.

At first, the SSD device 100 receive start of the retrieval of the bad blocks from a destination thereof via the host interface controller 114 (S301). This causes the control program 150 that operates on the CPU 111 in the SSD device 100 to start control for retrieving the bad blocks.

Next, the determination module 151 determines whether a memory ID and location information of the bad blocks are written in the serial flash memory 102 (S302).

If the determination module 151 determines that there is no memory ID and no location information written in the serial flash memory 102 (No at S302), the retrieval module 154 retrieves the bad blocks from all of the flash memory chips (e.g., the first flash memory chip 121 to the fourth flash memory chip 124) connected to the SSD device 100 (S311).

Subsequently, the register module 153 registers the memory IDs of all of the flash memory chips (e.g., the first flash memory chip 121 to the fourth flash memory chip 124) connected to the SSD device 100 in the serial flash memory 102, and registers the location information of the bad blocks, which is a retrieval result made by the retrieval module 154, in the serial flash memory 102 (S312). The processing is then completed.

By contrast, if the determination module 151 determines that the memory IDs and the location information of the bad blocks have already been written in the serial flash memory 102 (Yes at S302), the determination module 151 determines whether the memory IDs of the flash memory chips connected to the SSD device 100 match with the memory IDs registered in the serial flash memory 102 (S303). If they match with each other (Yes at S303), the process proceeds to S306.

On the contrary, if the determination module 151 determines that the memory IDs of the flash memory chips connected to the SSD device 100 do not match with the memory IDs registered in the serial flash memory 102 (No at S303), it is considered that the correspondence between the bad blocks in the flash memory chips mounted on the SSD device 100 and the bad blocks stored in the serial flash memory 102 is not correct. Thus, the bad blocks need to be examined. Therefore, the retrieval module 154 retrieves the bad blocks from the flash memory chip that stores therein the non-matched memory ID (S304). In the embodiment, the flash memory chip storing therein the non-matched memory ID is considered to be newly connected as a replacement. The retrieval module 154 reads the location information of the bad blocks written by a supplier of the flash memory chip in advance from the flash memory chip, thereby detecting the location information of the bad blocks.

The register module 153 then updates the location information in the serial flash memory 102 with the location information (chip number and block number) of the bad blocks, which is a retrieval result (S305). Before performing the update, the register module 153 deletes the location information of the removed flash memory chip.

The determination module 151 then determines whether the determination of whether the memory IDs of the flash memory chips match with the memory IDs registered in the serial flash memory 102 is completed for all of the flash memory chips connected to the SSD device 100 (S306). If the determination is yet to be completed (No at S306), the determination is made, starting from S303 again.

If the determination is completed for all of the flash memory chips (Yes at S306), the location information of the bad blocks in all of the flash memory chips is considered to be registered in the serial flash memory 102, and the processing is completed.

Accordingly, the location information of the bad blocks in the flash memory chips connected to the SSD device 100 is registered in the serial flash memory 102.

In this manner, after the location information of the bad blocks in the SSD device 100 is specified, an examination is made on the SSD device 100. In the process of the examination, the bad blocks stored in the serial flash memory 102 are used as reference to read and write data from and to a specified flash memory chip. At this time, if the data cannot be read and written from and to blocks other than the bad blocks, a flash memory chip is replaced as necessary. If the flash memory chip is replaced, the processing illustrated in FIG. 3 is performed again. Following such a process makes it possible to provide the SSD device 100 with high reliability.

The embodiment is explained as an example in which a flash memory chip is used. However, it is not limited to the flash memory chip, and may be applied to a replaceable flash memory board. In this case, except that flash memory boards with a flash memory chip mounted thereon are mounted on the SSD device, other configuration is the same as the configuration described above.

In a conventional SSD device, because the replaced flash memory chip cannot be detected, the detection of the bad blocks needs to be performed on all of the flash memory chips by a write read test. Thus, it takes a long time to perform the detection, and the detection may not be accurate in some cases.

By contrast, in the embodiment, in the manufacturing process of the SSD device 100, when an inspection is conducted again on the SSD device, having been inspected once, after a flash memory chip or a flash memory board is replaced, the location information written by the supplier of the flash memory in advance at the time of the shipment of the flash memory chip can be used as the location information of the flash memory chips not replaced or the bad blocks.

Furthermore, with the SSD device 100 according to the embodiment, the retrieval module 154 retrieves the location information written by the supplier in advance at the time of the shipment for the retrieval of the bad blocks from the replaced flash memory chip. This makes it possible to avoid the bad blocks accurately, and to provide the SSD device 100 with high reliability.

The SSD device 100 according to the first embodiment is explained as an example in which the location information of the bad blocks is retrieved before the shipment or the like. However, in the SSD device, a flash memory chip or a flash memory board may be replaced after the SSD device is shipped. If such replacement is made, the SSD device may not operate properly. Therefore, a second embodiment is explained as an example in which an abnormality caused by replacement of a flash memory chip or a flash memory board in the SSD device is detected.

Figure 4:
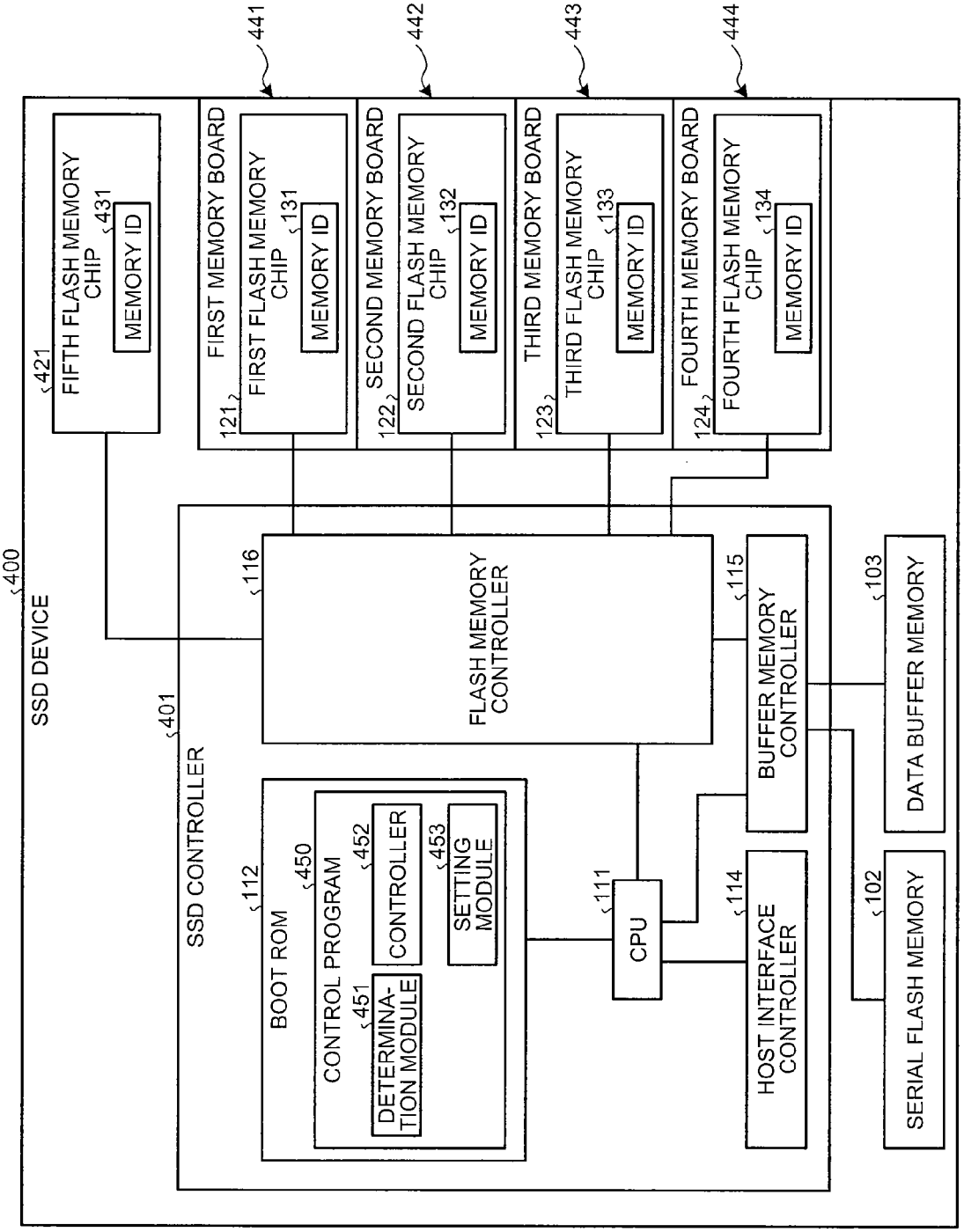
FIG. 4 is an exemplary block diagram of a configuration of an SSD device according to a second embodiment.

FIG. 4 is an exemplary block diagram of a configuration of an SSD device 400 according to the second embodiment. As illustrated in FIG. 4, compared with the SSD device 100 according to the first embodiment, the SSD device 400 according to the second embodiment has the following configuration: the SSD controller 101 is replaced with an SSD controller 401 that performs processing different from that by the SSD controller 101; each of the first flash memory chip 121 to the fourth flash memory chip 124 is mounted on the corresponding memory board; and a fifth flash memory chip 421 is added.

A first memory board 441 has the first flash memory chip 121 mounted thereon, a second memory board 442 has the second flash memory chip 122 mounted thereon, a third memory board 443 has the third flash memory chip 123 mounted thereon, and a fourth memory board 444 has the fourth flash memory chip 124 mounted thereon. In this manner, a flash memory chip can be replaced by replacing the corresponding memory board. However, if a user replaces it after the SSD device is shipped, a failure may occur. The embodiment prevents occurrence of such failure.

The fifth flash memory chip 421 is a memory chip mounted not on a memory board but on the SSD device 400 directly. The fifth flash memory chip 421 also holds a memory ID 431.

In the same manner as in the first embodiment, the serial flash memory 102 stores therein the memory IDs of the first flash memory chip 121 to the fifth flash memory chip 421, and location information of bad blocks in the flash memory chips.

Figure 5:
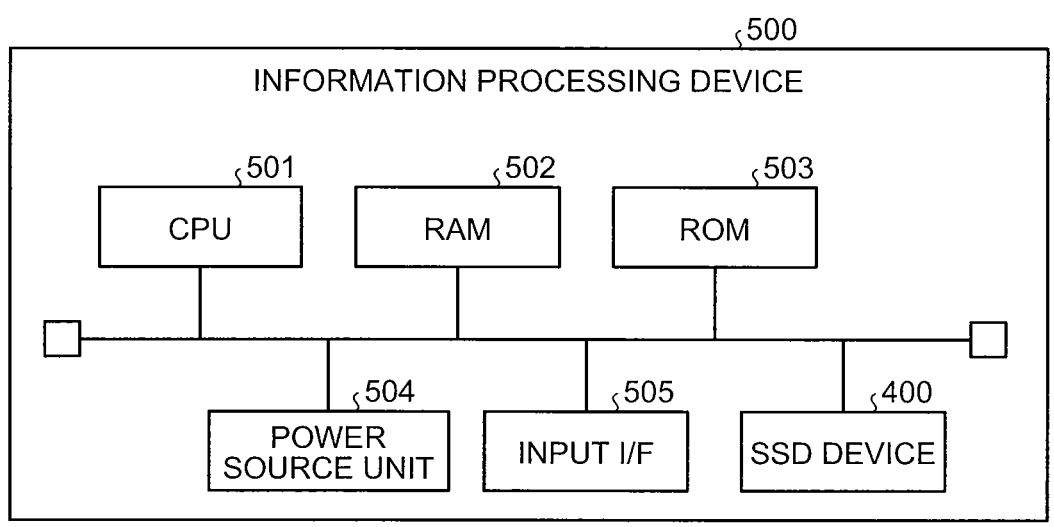
FIG. 5 is an exemplary view of a hardware configuration of a PC used as an information processing device in the second embodiment.

The SSD device 400 is used as a storage module for an information processing device. FIG. 5 is a view of a hardware configuration of a PC used as an information processing device. As illustrated in FIG. 5, an information processing device 500 comprises a CPU 501, a RAM 502, a ROM 503, a power source unit 504, an input interface (I/F) 505, and the SSD device 400.

In the information processing device 500 according to the embodiment, when the power is applied by the power source unit 504, the basic input/output system (BIOS) stored in the ROM 503 is read by the CPU 501, and the RAM 502 is used as a work area to start an initial operation. At this time, an initial operation is performed in the SSD device 400 as well.

Referring back to FIG. 4, the SSD controller 401 is different from the SSD controller 101 in the first embodiment in that the control program 150 installed in the boot ROM 112 is replaced with a control program 450.

The control program 450 comprises a determination module 451, a controller 452, and a setting module 453. The control program 450 is invoked when the power is applied.

The determination module 451 determines whether each of the memory IDs 131 to 134, and 431 stored in the flash memory chips 121 to 124, and 421 connected to the SSD device 400 matches with the memory IDs 201_1 to 201_4 stored in the serial flash memory 102.

The setting module 453 performs setting in accordance with the determination result of the determination module 451. For example, if the determination module 451 determines that each of the memory IDs of the flash memory chips does not match with any of the memory IDs registered in the serial flash memory 102, the setting module 453 performs the setting to notify that it is an abnormal state. If the determination module 451 determines that the memory IDs of all of the flash memory chips are registered in the serial flash memory 102, the setting module 453 performs the setting to notify that it is a normal state.

The controller 452 performs operational control in accordance with the setting made by the setting module 453. For example, if the determination module 451 determines that any of the memory IDs in the flash memory chips does not match with the memory IDs stored in the serial flash memory 102, the controller 452 performs operational control to be performed on the occurrence of a failure in accordance with the setting made by the setting module 453, notifying that it is an abnormal state. As for the operational control to be performed on the occurrence of a failure, the controller 452 performs control to stop using the location information of the bad blocks stored in the serial flash memory 102, and to prevent access from the host. If the determination module 451 determines that all of the memory IDs in the flash memory chips match with the memory IDs stored in the serial flash memory 102, the controller 452 performs normal operational control in accordance with the setting made by the setting module 453, notifying that it is a normal state. Because other operational control performed on the occurrence of a failure and normal operational control are considered to be the same as the control performed conventionally, the description thereof will be omitted.

As described above, with the SSD device 400 according to the second embodiment, in the same manner as in the first embodiment, a memory ID is stored in each of the flash memory chips, and the memory IDs of all of the flash memory chips are stored in the serial flash memory 102. The memory IDs of the flash memory chips are compared with the memory IDs of the serial flash memory when the power is applied. If the memory IDs of the flash memory chips do not match with the memory IDs stored in the serial flash memory, it is considered to be a failed state, and no normal response is made.

Figure 6:
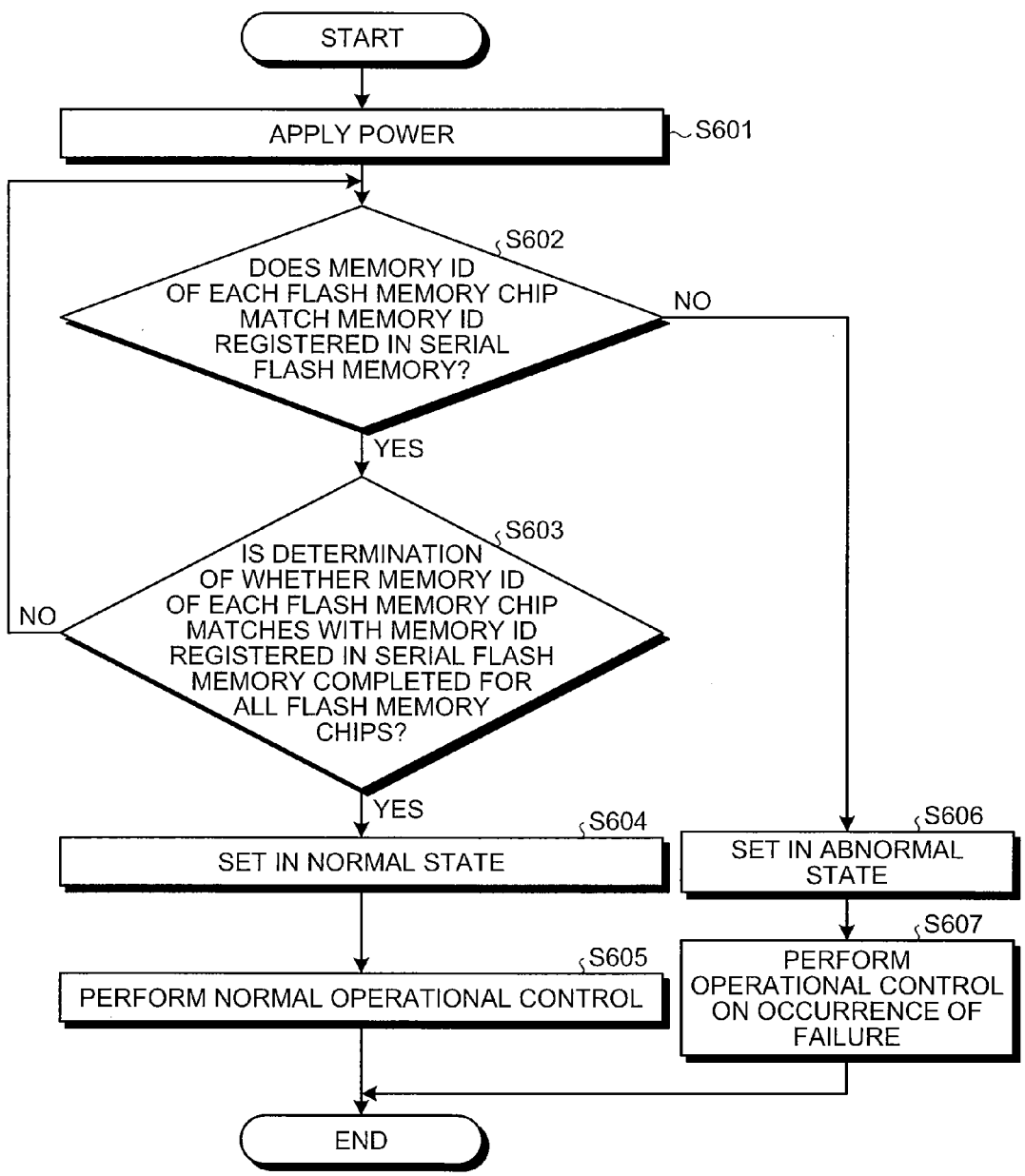
FIG. 6 is an exemplary flowchart of an initial operation when the power is applied in the SSD device in the second embodiment.

The initial operation when the power is applied in the SSD device 400 according to the second embodiment will now be described. FIG. 6 is a flowchart of the initial operation described above in the SSD device 400 according to the second embodiment.

At first, in response to application of the power in the information processing device 500, the power is started to be supplied to the SSD device 400 as well by the application of the power (S601).

Next, the determination module 451 determines whether each of the memory IDs of the flash memory chips connected to the SSD device 400 match with any of the memory IDs registered in the serial flash memory 102 (S602). If they match with each other (Yes at S602), the determination module 451 determines whether the determination of whether each of the memory IDs of the flash memory chips match with any of the memory IDs registered in the serial flash memory 102 is completed for all of the flash memory chips (S603). If the determination is yet to be performed for all of the flash memory chips (No at S603), the process returns to S602 to perform the processing again. By contrast, if the memory IDs of all of the flash memory chips match with the memory IDs registered in the serial flash memory 102 and the determination is completed (Yes at S603), the setting module 453 sets the SSD device 400 in a normal state (S604). The controller 452 then performs the normal operational control in accordance with the setting (S605).

On the contrary, if the determination module 451 determines that one of the memory IDs of the flash memory chips connected to the SSD device 400 do not match with any of the memory IDs registered in the serial flash memory 102 (No at S602), the setting module 453 sets the SSD device 400 in an abnormal state (S606). Subsequently, the controller 452 performs the operational control performed on the occurrence of a failure in accordance with the setting and the processing is then completed (S607). As an example of the operational control performed on the occurrence of a failure, an error conforming to a standard such as serial attached SCSI (SAS) and serial advanced technology attachment (SATA) is notified to the information processing device 500, which is the host.

As in the processing process described above, only when the memory IDs of the flash memories match with the memory IDs in the serial flash memory as a whole, it is determined that the location information of the bad blocks in the mounted flash memories is stored in the serial flash memory 102, and normal operation is continued.

In the second embodiment as well, the register module 153 and the like may be provided in the control program 450 and an inspection before the shipment may be conducted in the same manner as in the first embodiment.

Furthermore, a plurality of flash memory chips may be mounted on a flash memory board installed on the SSD device. In this case, the determination of whether the memory IDs of the flash memory chips match with the memory IDs registered in the serial flash memory may be performed on each flash memory board or on each of the flash memory chips mounted on the flash memory board.

Conventionally, it is not confirmed whether the correspondence between the location information of the bad blocks in the mounted flash memories and the location information of the bad blocks in the serial flash memory is correct. Therefore, if a flash memory (flash memory chip or flash memory board) is replaced, wrong location information of the bad blocks is used. As a result, the SSD device operates without avoiding the bad blocks properly.

By contrast, if a flash memory chip or a flash memory board is replaced, or if a flash memory chip fails to operate normally, the SSD device 400 according to the second embodiment can detect these conditions readily and prevent occurrence of malfunction.

The SSD devices 100 and 400 according to the first and the second embodiments have the configurations described above, thereby preventing inconsistency in the location information of the bad blocks in the replaced flash memory. Accordingly, the SSD devices 100 and 400 can prevent access when mismatching occurs in the location information of the bad blocks, thereby securing reliability.

In the first and the second embodiments, the memory IDs are used for determining whether a flash memory chip is replaced. However, usage of the memory IDs is not limited to the determination on whether a flash memory chip is replaced. Therefore, a third embodiment is explained as an example in which whether to set a test mode for conducting a test is determined based on the memory IDs when the power is applied.

Figure 7:
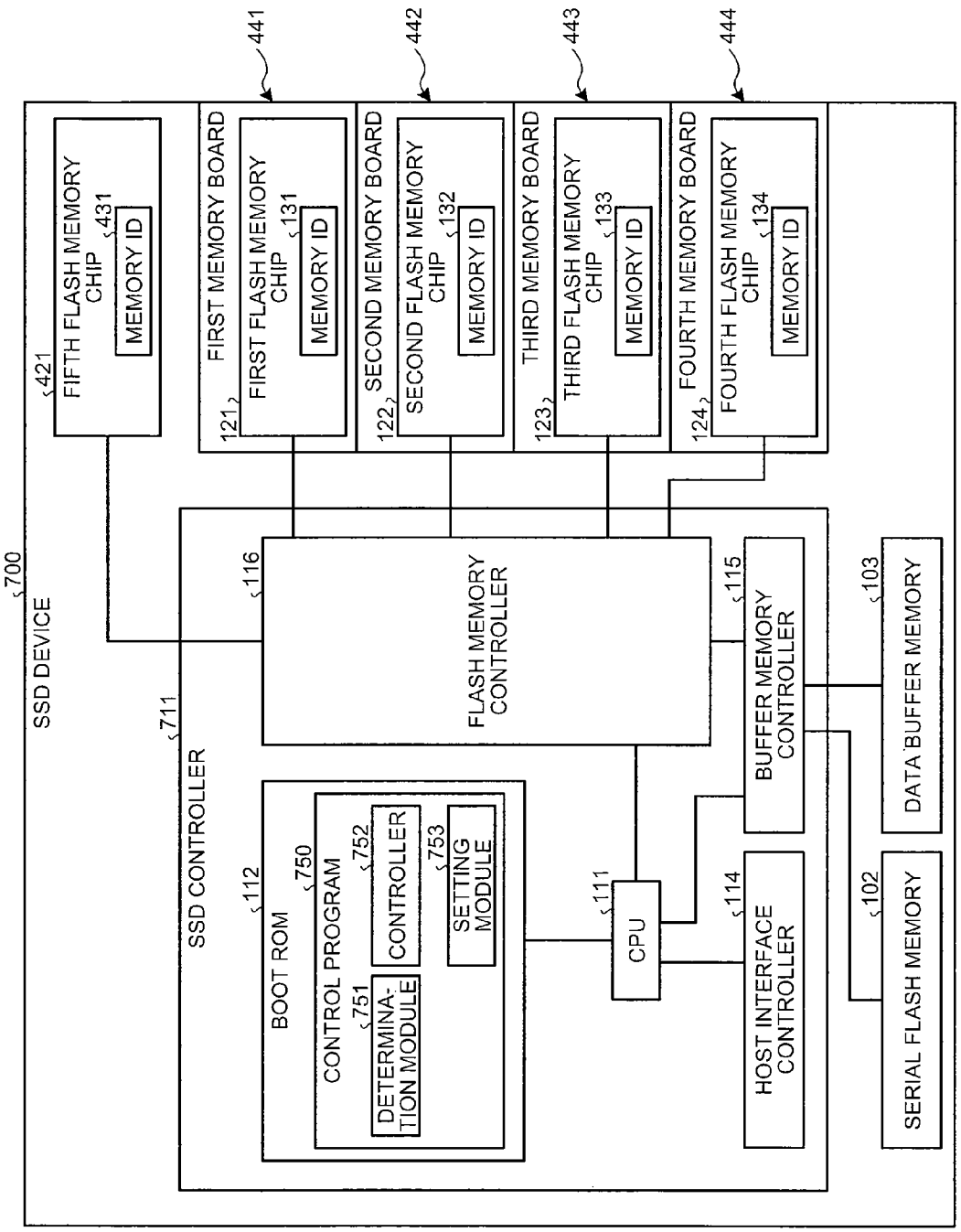
FIG. 7 is an exemplary block diagram of a configuration of an SSD device according to a third embodiment.

FIG. 7 is a block diagram of a configuration of an SSD device 700 according to the third embodiment. As illustrated in FIG. 7, compared with the SSD device 400 according to the second embodiment, the SSD device 700 according to the third embodiment has a configuration in which the SSD controller 401 is replaced with an SSD controller 711 that performs processing different from that by the SSD controller 401.

The SSD controller 711 is different from the SSD controller 401 according to the second embodiment in that the control program 450 installed in the boot ROM 112 is replaced with a control program 750.

The control program 750 comprises a determination module 751, a controller 752, and a setting module 753. The control program 750 is invoked when the power is applied.

The determination module 751 refers to the insides of the flash memory chips 121 to 124 connected to the SSD device 700 to determine whether the memory IDs are stored therein. If the determination module 751 cannot recognize the memory IDs, the determination module 751 determines that the flash memory chips or the memory boards are not connected. In this manner, the determination module 751 according to the third embodiment determines whether all of the memory boards are connected to the SSD device 700 based on the memory IDs of the flash memory chips.

In this manner, with the SSD device 700 according to the third embodiment, when all of the memory boards are removed, the SSD device 700 shifts to the test mode. With this configuration, if an inspector wants to test the SSD device 700, only by removing all of the memory boards from the SSD device 700 to boot it up, it is possible to cause the SSD device 700 to shift to the test mode. In the determination on whether the SSD device 700 shifts to the test mode in the embodiment, whether a memory ID is present in the fifth flash memory chip 421 is not determined. This is because the fifth flash memory chip 421 is mounted on the board of the SSD device 700 main body, and unlike memory boards, it cannot be removed readily.

The test mode is a mode for diagnosing whether the board of the SSD device 700 main body including the SSD controller 711 functions properly. In the test mode, because flash memory access to be performed in the normal operation is not performed, the processing of reading data required for the boot-up of the SSD device 700 from the flash memory is not performed when the power is applied. In the test mode, by control performed by the control program 750, the CPU 111 confirms connections and operations of the SSD controller 711, the serial flash memory 102, the data buffer memory 103, the flash memories, and the like, and generates a test result log to notify it to the host device (e.g., the information processing device 500).

The setting module 753 performs setting in accordance with the determination result of the determination module 751. For example, if the determination module 751 can refer to no memory ID, and determines that all of the memory boards are removed, the setting module 753 performs the setting for shifting to the test mode. If the determination module 751 can refer to one or more memory IDs of the flash memory boards, the determination module 751 determines that there is a connected memory board, and the setting module 753 performs the setting for shifting to the normal state.

The controller 752 performs operational control in accordance with the setting made by the setting module 753. For example, if the setting module 753 performs the setting so as to perform a normal operation because the determination module 751 can refer to the memory IDs of the flash memory boards, and determines that one or more memory boards are connected, the controller 752 performs a normal operation. If the setting module 753 performs the setting so as to shift to the test mode because the determination module 751 determines that all of the memory boards are removed, the controller 752 performs a test operation. Because the operational control performed in the test mode is considered to be the same as the control performed conventionally, the description thereof will be omitted.

Figure 8:
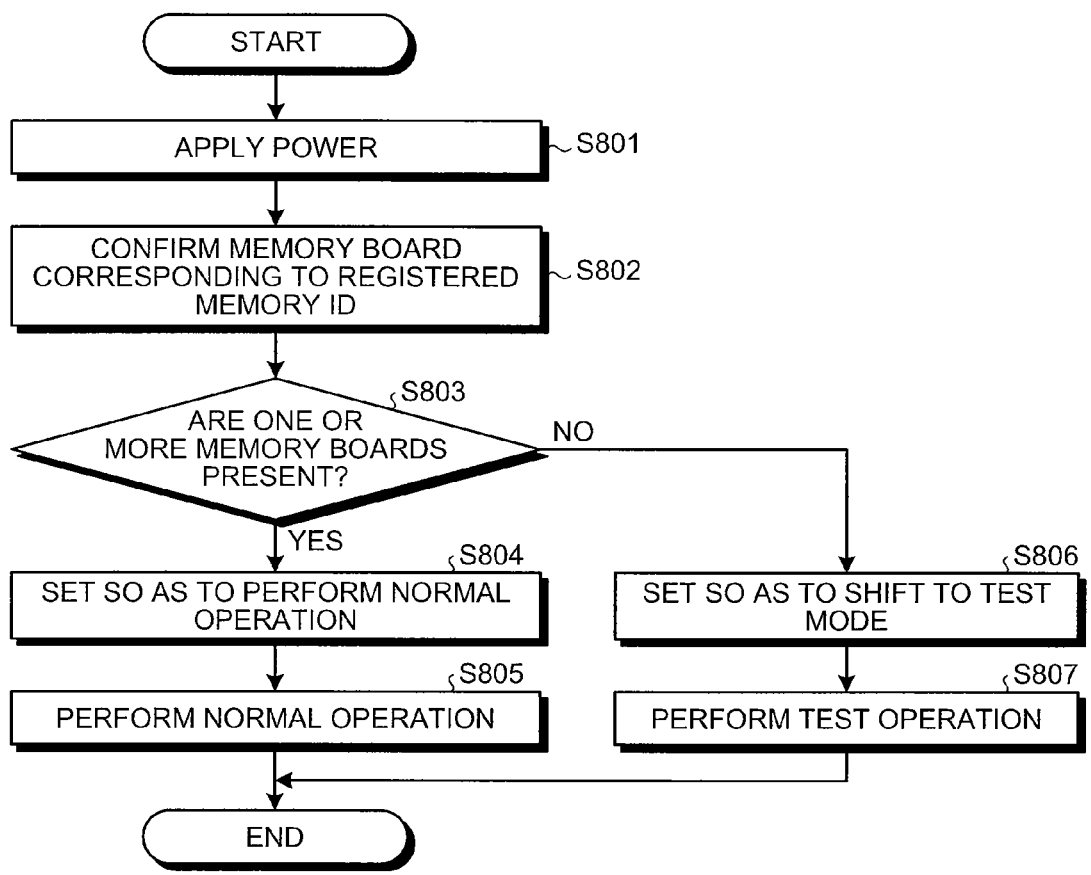
FIG. 8 is an exemplary flowchart of an initial operation when the power is applied in the SSD device in the third embodiment.

The initial operation when the power is applied in the SSD device 700 according to the third embodiment will now be described. FIG. 8 is a flowchart of the initial operation described above in the SSD device 700 according to the third embodiment.

At first, in response to application of the power performed by an inspector, the power is started to be supplied to the SSD device 700 as well by the application of the power (S801).

Next, the determination module 751 attempts to refer to a memory ID registered in the serial flash memory 102 to confirm whether a memory board corresponding to the memory ID is present (S802).

Subsequently, the determination module 751 determines whether one or more memory boards connected to the SSD device 700 are present (S803). If the determination module 751 determines that one or more memory boards are present (Yes at S803), the setting module 753 performs setting so as to perform the normal operation (S804). The controller 752 then performs normal operational control in accordance with the setting (S805).

By contrast, if the determination module 751 determines that no memory board connected to the SSD device 700 is present (No at S803), the setting module 753 performs setting so as to shift to the test mode (S806). The controller 752 performs the test operation in accordance with the setting, and the processing is completed (S807).

In this manner, with the SSD device 700 according to the embodiment, the board configuration is confirmed when the power is applied, and if the fact that no memory board (sub board) with a flash memory mounted thereon is connected is detected, the SSD device 700 shifts to the test mode for testing the board as a single body, and does not make a normal response to the host device (e.g., the information processing device 500).

The SSD device 700 according to the third embodiment is explained as an example in which the SSD device 700 shifts to the test mode when all of the memory boards are removed. However, it is not limited to the case where all of the memory boards are removed. For example, the SSD device 700 may shift to the test mode in the case where a predetermined number of memory boards are removed, such as the case where more than half of the memory boards are removed.

In a conventional SSD device, if all of the memory boards with flash memory chips mounted thereon are not connected, the SSD device is considered to be in a failed state, and the board of the SSD device main body cannot be diagnosed as a single body. Therefore, because a solder joint inspection is conducted with an analyzing device using X-ray, it takes time and costs.

By contrast, with the SSD device 700 according to the embodiment, in the manufacturing process of the SSD device 700, a diagnosis can be conducted on the board including the SSD controller 711 as a single body, which facilitates detection of malfunction such as abnormal connection.

Moreover, the various modules of the systems described herein can be implemented as software applications, hardware and/or software modules, or components on one or more computers, such as servers. While the various modules are illustrated separately, they may share some or all of the same underlying logic or code.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device, comprising:
a plurality of replaceable nonvolatile memories that each store respective unique identification information and are to be accessed from a host;
an identification information storage module configured to store therein a plurality of pieces of identification information that identify a plurality of nonvolatile memories, respectively;
a location information storage module configured to store therein pieces of location information each identifying a bad area in one of the nonvolatile memories identified by one of the pieces of identification information;
a determination module configured to determine whether the unique identification information stored in respective nonvolatile memories connected thereto matches any one of the pieces of identification information stored in the identification information storage module; and
a control module configured to prevent one of the pieces of location information stored in the location information storage module from being used, and to prevent access to one of the nonvolatile memories identified by one of the pieces of identification information from the host, when the determination module determines that one of the unique identification information of one of the nonvolatile memories does not match any one of the pieces of identification information stored in the identification information storage module.

2. The storage device of claim 1, further comprising a retrieval module configured to retrieve location information of a bad area from one of the nonvolatile memories when the determination module determines that the one of the unique identification information of the one of the nonvolatile memories does not match any one of the pieces of identification information stored in the identification information storage module.

3. The storage device of claim 2, further comprising a register module configured to register the location information of the bad area retrieved by the retrieval module, in the location information storage module.

4. The storage device of claim 3, wherein,
when the unique identification information of the nonvolatile memories are not stored in the identification information storage module, the retrieval module is configured to retrieve location information of bad areas from the nonvolatile memories, and,
when the unique identification information of the nonvolatile memories are not stored in the identification information storage module, the register module is configured to register the unique identification information of the nonvolatile memories connected thereto, and to register pieces of the location information of the bad areas retrieved by the retrieval module in the identification information storage module.

5. The storage device of claim 1, wherein the control module is further configured to perform an operation control to be carried out upon occurrence of failure, when the determination module determines that the unique identification information of the one of the nonvolatile memories does not match any one of the pieces of identification information stored in the identification information storage module.

6. The storage device of claim 5, wherein the control module is further configured to perform a normal operation control, when the determination module determines that all of the unique identification information of the nonvolatile memories match the pieces of identification information stored in the identification information storage module.

7. A control method performed in a storage device comprising a plurality of replaceable nonvolatile memories that each store respective unique identification information and are to be accessed from a host, an identification information storage module and a location information storage module, the identification information storage module storing therein a plurality of pieces of identification information that identify respective nonvolatile memories, the location information storage module storing therein pieces of location information each identifying a bad area in one of the nonvolatile memories identified by one of the pieces of identification information, the method comprising:

determining, by a determination module, whether the unique identification information stored in respective nonvolatile memories connected thereto matches any one of the pieces of identification information stored in the identification information storage module; and preventing one of the pieces of location information stored in the location information storage module from being used, and preventing access to one of the nonvolatile memories identified by one of the pieces of identification information from the host, when the determination module determines that one of the unique identification information of one of the nonvolatile memories does not match any one of the pieces of identification information stored in the identification information storage module.

8. The control method of claim 7, further comprising retrieving, by a retrieval module, location information of a bad area from one of the nonvolatile memories when the determination module determines that the one of the unique identification information of the one of the nonvolatile memories does not match any one of the pieces of identification information stored in the identification information storage module.

9. The control method of claim 8, further comprising registering, by a register module, the location information of the bad area retrieved by the retrieval module, in the location information storage module.

10. The control method of claim 9, wherein,
when the unique identification information of the nonvolatile memories are not stored in the identification information storage module, the retrieval module is configured to retrieve location information of bad areas from the nonvolatile memories, and
when the unique identification information of the nonvolatile memories are not stored in the identification information storage module, the register module is configured to register the unique identification information of the nonvolatile memories connected thereto, and to register pieces of the location information of the bad areas retrieved by the retrieval module in the identification information storage module.

11. The control method of claim 7, wherein an operation control to be carried out upon occurrence of failure is performed, when the determination module determines that the unique identification information of the one of the nonvolatile memories does not match any one of the pieces of identification information stored in the identification information storage module.

12. The control method of claim 11, wherein a normal operation control is performed, when the determination module determines that all of the unique identification information of the nonvolatile memories match the pieces of identification information stored in the identification information storage module.

* * * * *